US012687591B2

(12) United States Patent
Tang

(10) Patent No.: US 12,687,591 B2
(45) Date of Patent: Jul. 21, 2026

(54) POWER DELIVERY CONTROL AND OVER CURRENT PROTECTION

(71) Applicant: Infineon Technologies Austria AG, Villach (AT)

(72) Inventor: Benjamim Tang, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 518 days.

(21) Appl. No.: 18/116,773

(22) Filed: Mar. 2, 2023

(65) Prior Publication Data

US 2024/0295613 A1      Sep. 5, 2024

(51) Int. Cl.
G01R 31/40 (2020.01)
H02J 13/12 (2026.01)
H02M 3/155 (2006.01)

(52) U.S. Cl.
CPC .............. G01R 31/40 (2013.01); H02J 13/12 (2026.01); H02M 3/155 (2013.01)

(58) Field of Classification Search
CPC ..................................................... G01R 31/40
See application file for complete search history.

(56) References Cited

U.S. PATENT DOCUMENTS

| | | | |
|---|---|---|---|
| 7,301,313 B1 * | 11/2007 | Hart ........................ | G06F 1/263 |
| | | | 323/269 |
| 7,779,276 B2 | 8/2010 | Bolan et al. | |
| 9,413,271 B2 * | 8/2016 | Vogel .................... | H02M 3/285 |
| 9,568,975 B2 | 2/2017 | Sehgal et al. | |
| 9,891,700 B2 | 2/2018 | Tschirhart et al. | |
| 10,481,626 B1 | 11/2019 | Tang et al. | |
| 11,016,553 B2 | 5/2021 | McNamara et al. | |
| 2008/0052016 A1 | 2/2008 | Chapuis | |
| 2009/0296432 A1 | 12/2009 | Chapuis | |

OTHER PUBLICATIONS

European Extended Search Report, EP 24 15 9310, Jul. 15, 2024, pp. 1-11.

* cited by examiner

*Primary Examiner* — Reena Aurora
(74) *Attorney, Agent, or Firm* — Armis IP Law, LLC

(57)      ABSTRACT

A power distribution system as discussed herein includes one or more interconnected power converters. Each of the one or more power converters in the power distribution system is operative to: receive a respective input voltage; via a closed loop regulation, convert the respective input voltage into a respective output voltage; and dynamically adjust a magnitude of a respective setpoint reference voltage of regulating a magnitude of the respective output voltage based on: i) a magnitude of the respective input voltage, and ii) a magnitude of respective output current supplied by the respective output voltage. Based on analysis of operational parameters such as sample output voltage of the one or more power converters, an analyzer resource determines occurrence of one or more anomaly conditions.

26 Claims, 11 Drawing Sheets

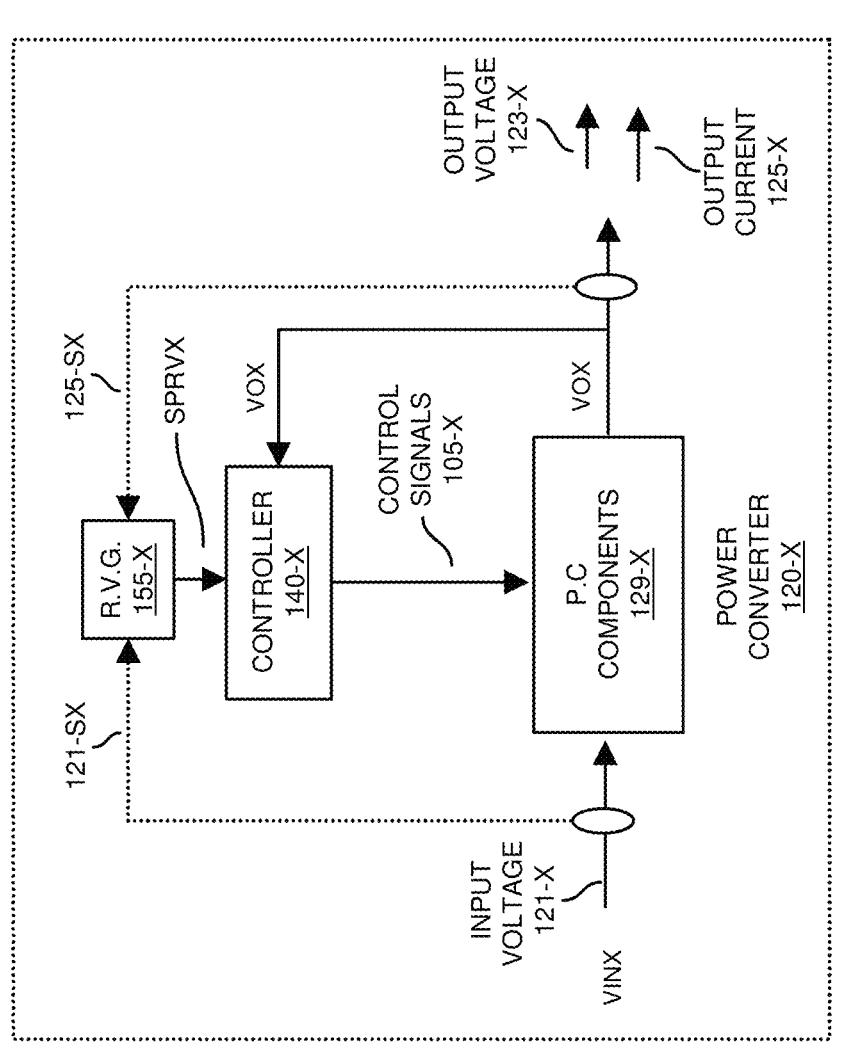
FIG. 1

EQUATION 400 →

$$Vout = Vtarg - Iout * Rho + alpha(Vin - Vinnom)$$

GRAPH 401 →

Table 1 - System Design Parameters

| | 120-11 | 120-21 | 120-22 | 120-23 | 120-24 | 120-25 | 120-26 | 120-27 | Comment |
|---|---|---|---|---|---|---|---|---|---|
| Vtarg | 12 | 5 | 1 | 5 | 3.3 | 1.2 | 1 | 1.8 | Vout target for regulator |
| Imax | 33.6 | 1 | 250 | 5 | 10 | 15 | 35 | 8 | Design target Imax for each regulator |
| Eff | 0.98 | 0.98 | 0.95 | 0.92 | 0.92 | 0.94 | 0.94 | 0.94 | Regulator Efficiency |
| Rho | 0.0229 | 0.1 | 0.0004 | 0.02 | 0.01 | 0.0067 | 0.0029 | 0.0125 | Rho = - dVout / dIout |
| alpha | 0 | 0.0833 | 0.0167 | 0.0833 | 0.055 | 0.2 | 0.0167 | 0.03 | Alpha = dVout / dVin |

Table 2 -

| | | | PC 120-11 (SPRV11) | PC 120-21 (SPRV21) | PC 120-22 (SPRV22) | PC 120-23 (SPRV23) | PC 120-24 (SPRV24) | PC 120-51 (SPRV25) | PC 120-6 (SPRV26) | PC 120-7 (SPRV27) | |
|---|---|---|---|---|---|---|---|---|---|---|---|
| System Type | Iout | Anomaly | VO1 | VO2-1 | VO2-2 | VO2-3 | VO2-4 | VO2-5 | VO2-6 | VO2-7 | Comment |
| Baseline, rho=0, alpha=0 | 0-Imax | eff_2 = 0.95/0.85 | 12 | 5 | 1 | 5 | 3.3 | 1.2 | 1 | 1.8 | All voltages are regulated to target |
| Detectable, rho0/alpha=0 | 0 | eff_2 = 0.95 | 12.3600 | 5.0300 | 1.0060 | 5.0300 | 3.3198 | 1.2072 | 1.0060 | 1.8108 | Vin at +3%, POL at +0.6% |
| 100 mV droop at Imax (POL) | Imax/2 | eff_2 = 0.95 | 11.9930 | 4.9494 | 0.9499 | 4.9494 | 3.2496 | 1.1499 | 0.9499 | 0.7498 | Vin ~0%, POL at - 50 mV |
| +/- 3% at 0 - Imax (Vin) | Imax | eff_2 = 0.95 | 11.6410 | 4.8701 | 0.8940 | 4.8701 | 3.1603 | 1.0928 | 0.8940 | 1.6892 | Vin at -3%, POL at -0.6% - 100 mV |
| alpha = | Imax | eff_2 = 0.85 | 11.5830 | 4.8653 | 0.8931 | 4.8653 | 3.1771 | 1.0917 | 0.8931 | 1.6675 | anomalous, all Vout are below min range |
| 80% line regulation (POL) | Imax/2 | eff_2 = 0.85 | 11.9630 | 4.9470 | 0.9494 | 4.9470 | 3.2480 | 1.1493 | 0.9494 | 1.7489 | anomalous, but Vout are in range |

SAMPLES 225-1 →

NO ANOMALIES

ANOMALY ASSOC WITH PC 121-22

FIG. 4

Voltage Regulator with Output Current and Input Voltage Dependence

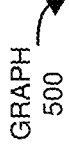

GRAPH 500

| | Io < 0 | 0 ≤ Io < Iomax | Iomax0 ≤ Io ≤ Ioff | Io > Ioff |
|---|---|---|---|---|
| Vin < Viuvp | Off  531 | Off  532 | Off  533 | Off  534 |
| Viuvp ≤ Vin < Vimin | $V_o + \alpha(V_{in} - V_i) + \beta(V_{in} - V_{imin})$  521 | $V_o + \alpha(V_{in} - V_i) + \beta(V_{in} - V_{imin}) - \rho\, I_o$  522 | $V_o + \alpha(V_{in} - V_i) + \beta(V_{in} - V_{imin}) - \rho\, I_o - \xi(I_o - I_{omax})$  523 | Off  535 |
| Vimin ≤ Vin < Vimax | $V_o + \alpha(V_{in} - V_i)$  524 | $V_o + \alpha(V_{in} - V_i) - \rho\, I_o$  511 | $V_o + \alpha(V_{in} - V_i) - \rho\, I_o - \xi(I_o - I_{omax})$  525 | Off  536 |
| Vimax ≤ Vin ≤ Viovp | $V_o + \alpha(V_{imax} - V_i)$  526 | $\dfrac{V_{onom}}{} + \alpha(V_{imax} - V_i) - \rho\, I_o$  527 | 528 $V_o + \alpha(V_{imax} - V_i) - \rho\, I_o - \xi(I_o - I_{omax})$ | Off  537 |
| Vin > Viovp | Off  538 | Off  539 | Off  540 | Off  541 |

Vin – input voltage
Vi – Input Voltage nominal

Vimin – Input Voltage nom range minimum
Vimax – Input Voltage nom range maximum

Viuvp – Vin undervoltage protection threshold
Viovp – Vin overvoltage protection threshold Vout – output voltage
Vo – output voltage nominal
at Vi=Vinom, Io = 0

Io – output current
Iomax – output current nom range maximum
Ioff – output current shutdown threshold α – dVout / dVin nom range
β – additional dVout / dVin
ext Vin range ρ – dVout / dIo nom range
ξ – additional -dVout / dIo,
ext Io range

FIG. 5

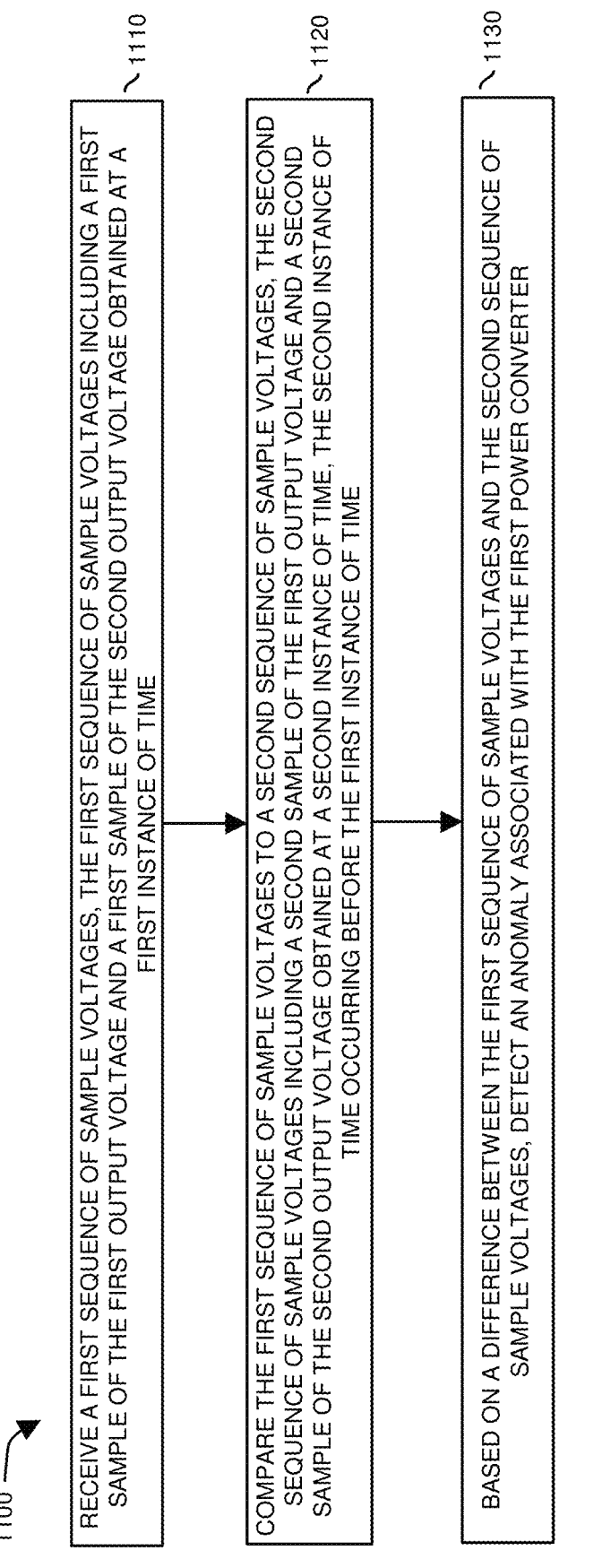

1100

RECEIVE A FIRST SEQUENCE OF SAMPLE VOLTAGES, THE FIRST SEQUENCE OF SAMPLE VOLTAGES INCLUDING A FIRST SAMPLE OF THE FIRST OUTPUT VOLTAGE AND A FIRST SAMPLE OF THE SECOND OUTPUT VOLTAGE OBTAINED AT A FIRST INSTANCE OF TIME

1110

COMPARE THE FIRST SEQUENCE OF SAMPLE VOLTAGES TO A SECOND SEQUENCE OF SAMPLE VOLTAGES, THE SECOND SEQUENCE OF SAMPLE VOLTAGES INCLUDING A SECOND SAMPLE OF THE FIRST OUTPUT VOLTAGE AND A SECOND SAMPLE OF THE SECOND OUTPUT VOLTAGE OBTAINED AT A SECOND INSTANCE OF TIME, THE SECOND INSTANCE OF TIME OCCURRING BEFORE THE FIRST INSTANCE OF TIME

1120

BASED ON A DIFFERENCE BETWEEN THE FIRST SEQUENCE OF SAMPLE VOLTAGES AND THE SECOND SEQUENCE OF SAMPLE VOLTAGES, DETECT AN ANOMALY ASSOCIATED WITH THE FIRST POWER CONVERTER

POWER DELIVERY CONTROL AND OVER CURRENT PROTECTION

BACKGROUND

Point-of-load converters (PoLs) are used in distributed power architectures (DPAs) to step down a relatively high power distribution bus voltage to the lower voltages needed by system components such as microprocessors, ASICs, and other digital ICs.

For example, DPAs are used in systems of all sizes to improve power distribution efficiency. Larger systems tend to use higher distribution voltages. In small portable systems, 5 Vdc or 12 Vdc are common, 48 Vdc is often seen in data centers, and in larger installations such as large data centers or telecommunications central offices, 380 Vdc is used.

In the case of distribution voltages of 48V and above, the distribution voltage is typically stepped down to an intermediate voltage to power the PoLs, creating a two-stage power conversion chain.

The use of power conversion to an intermediate bus voltage is typically desirable because it is not efficient to directly convert higher voltages directly to the very low voltages needed by today's advanced digital ICs. These input voltages are stepped down to lower voltages, typically between 3.3V and 0.8V.

The scale of the systems involved require many independent supply rails to be generated, and an extensive power supply distribution network with many stages of conversion and interdependency between rails due to the sharing or interaction of supply sources and intermediate buses.

BRIEF DESCRIPTION

This disclosure includes the observation that conventional power distribution systems suffer from deficiencies. For example, an anomaly may occur in any of one or more of the power converters in a power distribution system while going undetected. The techniques as discussed herein provide a way to detect operating anomalies via a correlation of the output voltages of the power converters.

More specifically, in one example, a power distribution system as discussed herein includes first power converter. The first power converter is operative to: receive a first input voltage; via first closed loop regulation, convert the first input voltage into a first output voltage; and dynamically adjust a magnitude of a first setpoint reference voltage of regulating a magnitude of the first output voltage based on: i) a magnitude of the first input voltage, and ii) a magnitude of first output current supplied by the first output voltage.

The first input voltage may be received from or generated by a second power converter and a third power converter. In such an instance, a second setpoint reference voltage of the second power converter is used by the second power converter to regulate generation of the second output voltage. The magnitude of the first output voltage may vary depending on an amount of output current supplied by the first input voltage to the second power converter and a third power converter.

Still further, the first power converter may include a first setpoint reference voltage generator operative to: generate the first setpoint reference voltage based on: i) application of a first weight value to the magnitude of the first output current, and ii) application of a second weight value to a difference between the magnitude of the first input voltage and a nominal voltage value associated with generating the first input voltage.

The apparatus or system as further discussed herein may include one or more additional power converters such as a second power converter operative to: receive the first output voltage from the first power converter; via second closed loop regulation, convert the first output voltage into a second output voltage; and dynamically adjust a magnitude of a second setpoint reference voltage of regulating the second output voltage based on: i) a magnitude of the first output voltage received from the first power converter, and ii) a magnitude of second output current supplied by the second output voltage.

As further discussed herein, the power supply system can be configured to include a storage resource operative to receive and store status information from the various regulators indicating different magnitudes of the first output voltage and the second output voltage at different instances of time. An analyzer operative to utilize the stored status information to detect an anomaly associated with the second power converter producing the second output voltage. An anomalous condition of the second power converter producing the second output voltage causes an adjustment to the magnitude of the first setpoint reference voltage different than what would occur if the second power converter were operating without an anomaly.

Yet further, note that the anomalous condition can be any condition in which the power converter discontinues operating properly. For example, the anomalous condition may be excess current consumed by the second power converter to produce the second output voltage.

In accordance with still further examples as discussed herein, the power supply system can be configured to include a second power converter operative to: receive the first input voltage; via second closed loop regulation implemented by the second power converter, convert the first input voltage into a second output voltage; and dynamically adjust a magnitude of a second target voltage value of regulating the second output voltage based on: i) a magnitude of the first input voltage, and ii) a magnitude of second output current supplied by the second output voltage. In such an instance, an anomalous condition (such as poor voltage conversion efficiency, etc.) of the second power converter producing the second output voltage causes an adjustment to the magnitude of the first setpoint reference voltage. As previously discussed, the anomalous condition may be excess current consumed by the second power converter to produce the second output voltage.

In still further examples, the power supply system is described herein can be configured to include a storage resource. The storage resource is configured to receive and store status information indicating different magnitudes of the first output voltage and the second output voltage at different instances of time. An analyzer associated with the power supply system uses (analyzes) the stored status information to detect an anomaly associated with the second power converter producing the second output voltage. The analyzer can be configured to compare a current sample magnitude of the first output voltage and a current sample magnitude of the second output voltage to the status information to detect the anomaly.

In accordance with still further examples as described herein, the first power converter can be configured to include a first setpoint reference voltage generator operative to: receive a first target output voltage value assigned to the first power converter; receive a first input voltage value indicative of the magnitude of the first input voltage; receive a first output current value indicative of the magnitude of the first output current supplied by the first output voltage; derive the first setpoint reference voltage for regulating the first output voltage based on the first target output voltage, the first input voltage value, and the first output current value; and regulate the magnitude of the first output voltage to be substantially equal to the first setpoint reference voltage.

Still further, as discussed herein, a power distribution system can be configured to include the first power converter and a second power converter. The second power converter is operative to: receive the first output voltage; via second closed loop regulation, convert the first output voltage into a second output voltage; dynamically adjust a second setpoint reference voltage of regulating a magnitude of the second output voltage based on: i) a magnitude of the first output voltage, and ii) a magnitude of second output current, the second output current supplied by the second output voltage; wherein the magnitude of the second setpoint reference voltage varies depending on the magnitude of the first output current and the magnitude of the first input voltage; the power distribution system further comprising: a third power converter operative to convert the first output voltage into a third output voltage, the third output voltage regulated based on a third setpoint reference voltage, the third setpoint reference voltage generated based on a magnitude of third output current supplied by the third output voltage.

The analyzer is described herein can be configured in any suitable manner. In accordance with one example, the analyzer is implemented as a neural network operative to detect an anomaly associated with a power distribution system including the first power converter. The analyzer detects the anomaly based on a magnitude of the first output voltage.

Still further examples as discussed herein include a system comprising monitor hardware. The monitor hardware is operative to: receive a first sequence of sample voltages, the first sequence of sample voltages including a first sample of a first output voltage of a first power converter and a first sample of a second output voltage of a second power converter obtained at a first instance of time; compare the first sequence of sample voltages to a second sequence of sample voltages, the second sequence of sample voltages including a second sample of the first output voltage and a second sample of the second output voltage obtained at a second instance of time, the second instance of time occurring before the first instance of time; and based on a comparison of the first sequence of sample voltages and the second sequence of sample voltages, detect an anomaly associated with the first power converter.

Yet further, the second power converter in the system is operative to convert the first output voltage received from the first power converter into the second output voltage; a magnitude of the second output voltage depends on a magnitude of the first output voltage and a magnitude of current supplied by the second output voltage. The monitor hardware is operative to detect the anomaly based on a difference between the first sequence of sample voltages and the second sequence of sample voltages.

Another example method as discussed herein includes: receiving a first input voltage; via first closed loop regulation, converting the first input voltage into a first output voltage; and dynamically adjusting a first target voltage value of regulating the first output voltage based on: i) a magnitude of the first input voltage, and ii) a magnitude of first output current supplied by the first output voltage. The dynamic adjusting of the first target voltage value includes:

generating the first setpoint reference voltage based on: i) application of a first weight value to the magnitude of the first output current, and ii) apply a second weight value to a difference between the magnitude of the first input voltage and a nominal voltage value of a second power converter producing the first input voltage.

These and other more specific examples are disclosed in more detail below.

Note that although examples as discussed herein are applicable to overcurrent and degraded efficiency in distributed power voltage converter applications, the concepts disclosed herein may be advantageously applied to any other suitable power converter topologies as well as general power supply control applications and power distribution.

Note further that one or more computerized devices or processors can be programmed and/or configured to operate as explained herein to carry out the different examples as described herein.

Yet other examples herein include software programs to perform the steps and operations summarized above and disclosed in detail below. One such example comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, examples herein are directed to methods, systems, computer program products, etc., that support operations as discussed herein.

One example herein includes a computer readable storage medium and/or system having instructions stored thereon. The instructions, generally, when executed by computer processor hardware, cause the computer processor hardware (such as one or more co-located or disparately located processor devices) to: receive a first input voltage; via first closed loop regulation, convert the first input voltage into a first output voltage; dynamically adjust a first setpoint reference voltage of regulating a magnitude of the first output voltage based on: i) a magnitude of the first input voltage, and ii) a magnitude of first output current supplied by the first output voltage.

Another example herein includes a computer readable storage medium and/or system having instructions stored thereon. The instructions, generally, when executed by computer processor hardware, cause the computer processor hardware (such as one or more co-located or disparately located processor devices) to: receive a first sequence of sample voltages, the first sequence of sample voltages including a first sample of a first output voltage of a first power converter and a first sample of a second output voltage of a second power converter obtained at or around a first instance of time; compare the first sequence of sample voltages to a second sequence of sample voltages, the second sequence of sample voltages including a second sample of the first output voltage and a second sample of the second output voltage obtained at or around a second instance of time, the second instance of time occurring before the first instance of time; and based on a comparison of the first sequence of sample voltages and the second sequence of sample voltages, detect an anomaly associated with the first power converter.

The ordering of the steps above has been added for clarity sake. Note that any of the processing steps as discussed herein can be performed in any suitable order.

Other examples of the present disclosure include software programs and/or respective hardware to perform any of the method example steps and operations summarized above and disclosed in detail below.

It is to be understood that the system, method, apparatus, instructions on computer readable storage media, etc., as discussed herein also can be implemented strictly as a software program, firmware, as a hybrid of software, hardware and/or firmware, or as hardware alone such as within a processor (hardware or software), or within an operating system or a within a software application.

As discussed herein, techniques herein are well suited for use in the field of supporting switching power supplies. However, it should be noted that examples herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be implemented and viewed in many different ways.

Also, note that this preliminary discussion of examples herein (BRIEF DESCRIPTION OF EXAMPLES) purposefully does not specify every example and/or incrementally novel aspect of the present disclosure or claimed invention(s). Instead, this brief description only presents general examples and corresponding points of novelty over conventional techniques. For additional details and/or possible perspectives (permutations) of the invention(s), the reader is directed to the Detailed Description section (which is a summary of examples) and corresponding figures of the present disclosure as further discussed below.

BRIEF DESCRIPTION OF THE DRAWINGS

FIG. 1 is an example general diagram illustrating implementation of one of multiple power converters as discussed herein.

FIG. 4 is an example diagram illustrating configuration settings and monitoring power converter output voltage samples obtained under different conditions as discussed herein.

FIG. 5 is an example diagram illustrating different possible operating conditions associated with a respective power converter as discussed herein.

FIG. 11 is an example diagram illustrating a method as discussed herein.

Figure 2:
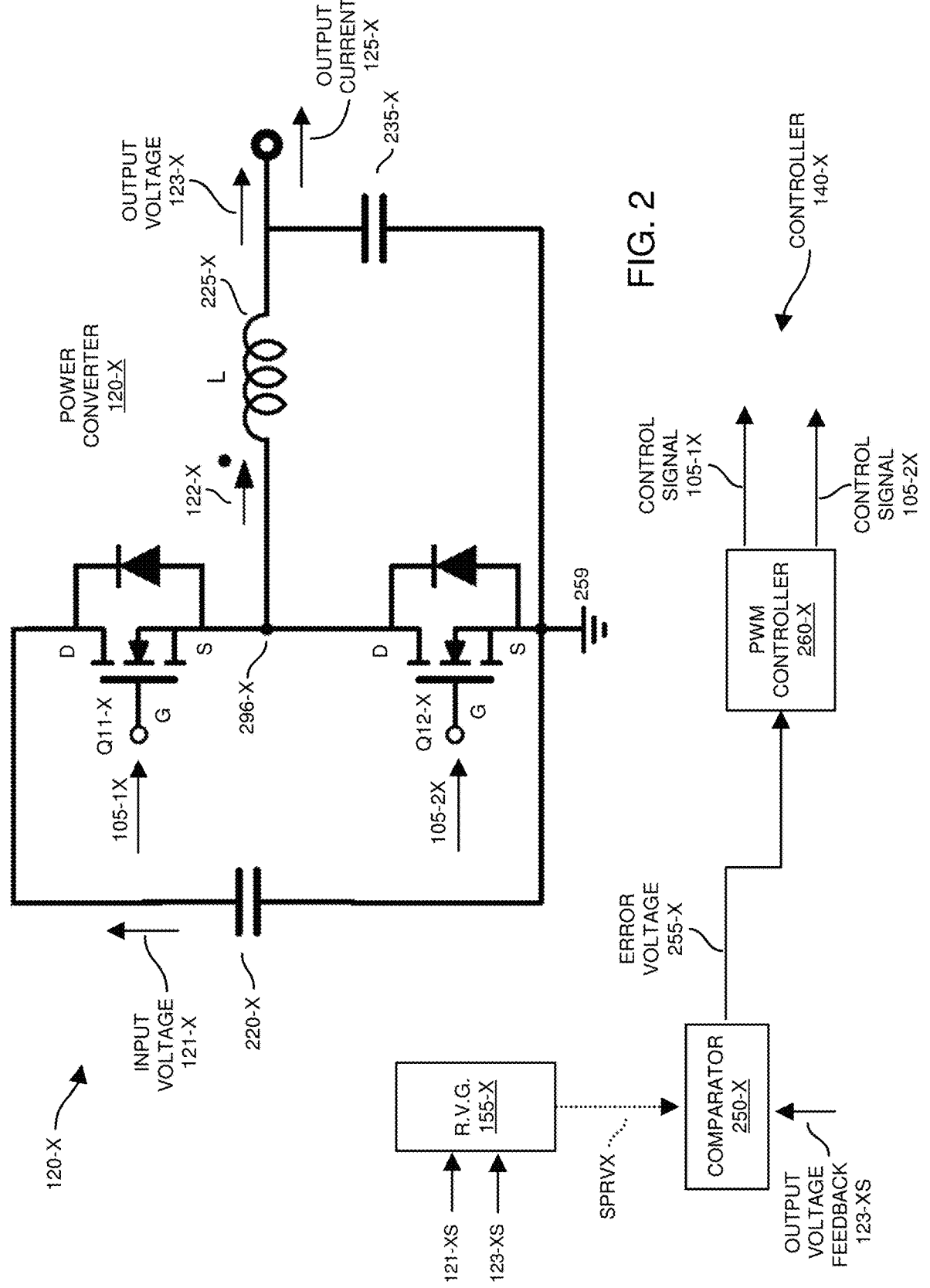
FIG. 2 is an example diagram illustrating a specific implementation of a power converter as discussed herein.

The foregoing and other objects, features, and advantages of the invention will be apparent from the following more particular description of examples herein, as illustrated in the accompanying drawings in which like reference characters refer to the same parts throughout the different views. The drawings are not necessarily to scale, with emphasis instead being placed upon illustrating the examples, principles, concepts, etc.

DETAILED DESCRIPTION

A monitoring system for maximizing the observability of system anomalies and adaptability to changing conditions is beneficial to optimize the power delivery and overall capability of the system. A methodology for improving anomaly detection in distributed power supply systems is described herein. The voltage regulators (a.k.a., power converters) in such a system implement a relationship between the output voltage and both the output current and input voltage to the regulator. In a power supply distribution system involving multiple regulators and regulation stages, this relationship increases the correlation between the voltages of all rails in the system. The increased correlation (via encoded output voltage levels in a chain or network of one or more power converters) is useful for anomaly detection since the sample voltages can be profiled to represent the nominal operating range of the system, and the system can monitor newly received voltage samples of thee power converters to detect anomalies associated with one or more of the power converters. This approach is also useful for systems that have complex modes of operation, such as dynamic power allocation, where the operating constraints can be highly variable and optimizing the power delivery is highly desirable. If desired, note that additional system information, such as additional redundant sensors, current sensors, and temperature sensors can also be included and profiled. Profiling is a classical multi-parameter classification problem, and there are several algorithms that can be effectively used to identify corresponding anomalies.

Now, more specifically, FIG. 1 is an example general diagram illustrating implementation of one of multiple power converters as discussed herein.

As previously discussed, examples herein include implementing one or more voltage-current control relationships amongst multiple power converters in a distributed power system to improve the observability of anomaly or non-nominal behavior through monitoring of a respective output voltage of each interconnected power converter in the power distribution system.

The premise is as follows:

Individual converters output voltage is dependent on load current and input voltage over nominal and non-nominal ranges Anomalous behavior is detectable as an unusual or unexpected distribution of bus and rail voltages (i.e the system's voltage profile)

Unexpected loads on buses

Excessive load current

Poor converter efficiency

Converter dropout (inability to sustain the target output voltage) due to component degradation Excessive distribution losses Anomalous or failed voltage or current sensors Dynamic power allocation limitation and mis-allocation Anomalous behavior of one converter has an impact on voltages of related converters sharing some of the power distribution path Voltage monitoring of buses can be achieved via either intelligent supplies with dedicated input and output voltage telemetry or supplementary voltage monitors in the system as redundant sensors or providing coverage for "dumb" voltage converters with no telemetry support Main Idea—Implement respective voltage regulator output in a distributed power system to be dependent on the load current and input voltage This will make the voltage in each system rail correlate to the overall power system station.

For example, the increase in current draw from one output rail will cause some/most/all rail voltages to change (by a small amount).

This increased correlation allows monitoring of the entire system to be accomplished by profiling the voltages.

Anomalies in the system will result in an anomaly in the voltage profile (an unexpected undervoltage in one or more rails).

The undervoltage will be more significant if the system is closer to the power limitation of the system.

Main Elements

Voltage regulators (power converters) which can implement the required current and voltage relationships.

System which can monitor the rail voltages through telemetry and sensors.

Redundancy of sensors is desirable to increase correlation.

Increased input voltage-output current correlation amongst the power converter makes it easier to detect small deviations from voltage profile.

Profiling of system rail voltages using correlation of voltages to determine if anomalies exist.

AI (artificial Intelligence) or classic classification methods can be used to monitor for anomalies such as:

Unexpected loads on buses

Excessive load current on rails

Poor converter efficiency

Converter dropout (inability to sustain the target output voltage) due to component degradation Excessive distribution losses Anomalous or failed voltage or current sensors Dynamic power allocation limitation and mis-allocation As shown in FIG. 1, the power distribution system 100 as discussed herein can be configured to one or more power converters configured in a manner as power converter 120-X, where X represents the $X^{th}$ power converter in a power distribution system. For example, the example power converter 120-X includes a (dynamic) reference voltage generator 155-X, controller 140-X, and corresponding power converter components 129-X (circuitry such as switches, inductors, capacitors).

As further shown, the power converter components 129-X receive the input voltage 121-X (VINX) from a source such as a prior power converter stage. Based on the input voltage 121-X, power converter components 129-X of the power converter 120-X produce the output voltage 123-X. In other words, the power converter components and circuitry associated with power converter 120-X convert the input voltage 121-X into the output voltage 123-X. The output voltage 123-X supplies output current 125-X to a subsequent power converter stage and/or corresponding load.

As previously discussed, the power converter 120-X includes reference voltage generator 155-X. The reference voltage generator 155-X produces (adjusts) a corresponding setpoint reference voltage SPRVX based on the magnitude of the input voltage 121-X (as indicated by the signal 121-SX) and the magnitude of the output current 125-X (as indicated by the signal 125-SX) supplied by the output voltage 123-X. Based on a combination of the signal 121-SX and the signal 125-SX, the reference voltage generator 155-X produces the respective setpoint reference voltage SPRVX supply to controller 140-X. The output voltage can be derived based on any suitable function of the magnitude of the input voltage 121-X and the magnitude of the output current 125-X.

The controller 140-X monitors a magnitude of the output voltage 123-X (a.k.a., VOX) and produces corresponding control signals 105-X to maintain the magnitude of the output voltage to be substantially equal to the setpoint reference voltage SPRVX. Thus, the magnitude of the output voltage 123-X is generated as a function of the magnitude of the input voltage 121-X as well as a magnitude of the output current 125-X.

Accordingly, the respective power converter 120-X is operative to: receive an Xth input voltage 121-X; via implementation of corresponding Xth closed loop regulation (such as feedback of signal 121-SX and signal 125-SX), convert the received input voltage 121-X into a first output voltage 123-X; and dynamically adjust a magnitude of a first setpoint reference voltage SPRVX of regulating a magnitude of the output voltage 123-X based on: i) a magnitude of the input voltage 121-X, and ii) a magnitude of the output current 125-X supplied by the output voltage 123-X to a next power converter or load.

FIG. 2 is an example diagram illustrating implementation of a power converter as discussed herein.

In this non-limiting example, the power converter 120-X is configured as a buck converter including voltage source 220-X (providing input voltage 121-X), switch Q11-X, switch Q12-X, inductor 225-X, and output capacitor 235-X.

Although the power converter 120-X in FIG. 2 is a buck converter configuration, note again that the power converter 120-X can be instantiated as any suitable type of voltage converter and include any number of phases, providing regulation as described herein.

As shown, the switch Q11-X of power converter 120-X is connected in series with switch Q12-X between the source 220-X supplying the input voltage 121-X and corresponding ground reference node 259. The power converter 120-X further includes inductor 225-X extending from the node 296-X to the output capacitor 235-X.

Via switching of the switches Q11-X and Q12-X based on respective control signals 105-1X (applied to gate G of switch Q11-X) and 105-2X (applied to gate G of switch Q12-X), node 296-X coupling the source (S) node of switch Q11-X and the drain (D) node of switch Q12-X provides output current 125-X through the inductor 225-X, resulting in generation of the output voltage 123-X powering a next power converter or load.

As previously discussed, the controller 140 can be configured to control switching of the switches Q11-X and Q12-X based on one or more feedback parameters. For example, the controller 140-X can be configured to receive output voltage feedback signal 123-XS derived from the output voltage 123-X as previously discussed in FIG. 1. The output voltage feedback signal 123-XS can be the output voltage 123-X (VOX) itself or a proportional derivative voltage thereof.

Referring again to FIG. 2, via the comparator 250-X, the controller 140-X compares the output voltage feedback signal 123-SX (such as output voltage 123-X itself or derivative, or proportional signal) to the reference voltage SPRVX. As previously discussed, the setpoint reference voltage SPRVX is a desired setpoint in which to control a magnitude of the output voltage 123-X during load-line regulation implemented by the power converter 120-X. Also, as previously discussed, during load-line regulation, a magnitude of the setpoint reference voltage SPRVX varies depending on the magnitude of the output current 123-X (as indicated by signal 123-XS) and the input voltage 121-X (as indicated by signal 121-XS).

Based on comparison of the output voltage feedback signal 123-XS and the setpoint reference voltage SPRVX, the comparator 250-X produces a respective error voltage 255-X based on the difference between the output voltage feedback signal 123-XS and the setpoint reference voltage SPRVX. A magnitude of the error voltage 255-X generated by the comparator 250-X varies depending upon the degree to which the magnitude of the output voltage 123-X is in or out of regulation (with respect to the reference voltage SPRVX).

As further shown, the PWM (Pulse Width Modulation) controller 260-X of the controller 140-X controls operation of switching the switches Q11-X and Q12-X based upon the magnitude of the error voltage 255-X. For example, if the error voltage 255-X indicates that the output voltage 123-X becomes less than a magnitude of the reference voltage SPRVX, the PWM controller 260-X increases a duty cycle and/or frequency of activating the high side switch Q11-X (thus decreasing a duty cycle of activating the low-side switch Q12-X) in a respective switch control cycle.

Conversely, if the error voltage 255-X indicates that the output voltage 123-X becomes greater than a magnitude of the reference voltage SPRVX, the PWM controller 260-X decreases a duty cycle and/or frequency of activating the high side switch Q11-X (thus increasing a duty cycle of activating the low-side switch Q12-X) in a respective switching control cycle.

As is known in the art, the controller 140-X controls each of the switches Q11-X and Q12-X ON and OFF at different times to prevent short-circuiting of the input voltage 121-X to the ground reference voltage (259). For example, when the switch Q11-X is activated to an ON state, the switch Q12-X is deactivated to an OFF state. Conversely, when the switch Q11-X is deactivated to an OFF state, the switch Q12-X is activated to an OFF state. Note that the controller 140-X implements a dead time between state ON-OFF and OFF-ON state transitions to prevent shorting of the input voltage 121-X to the ground reference 259.

Via variations in the pulse with modulation of controlling the respective switches Q11-X and Q12-X, the controller 140-X controls (regulates) generation of the output voltage 123-X such that the output voltage 123-X remains within a desired voltage range with respect to the setpoint reference voltage SPRVX. Thus, via regulation, the magnitude of the output voltage 123-X follows the magnitude of the setpoint reference voltage SPRVX.

Figure 3:
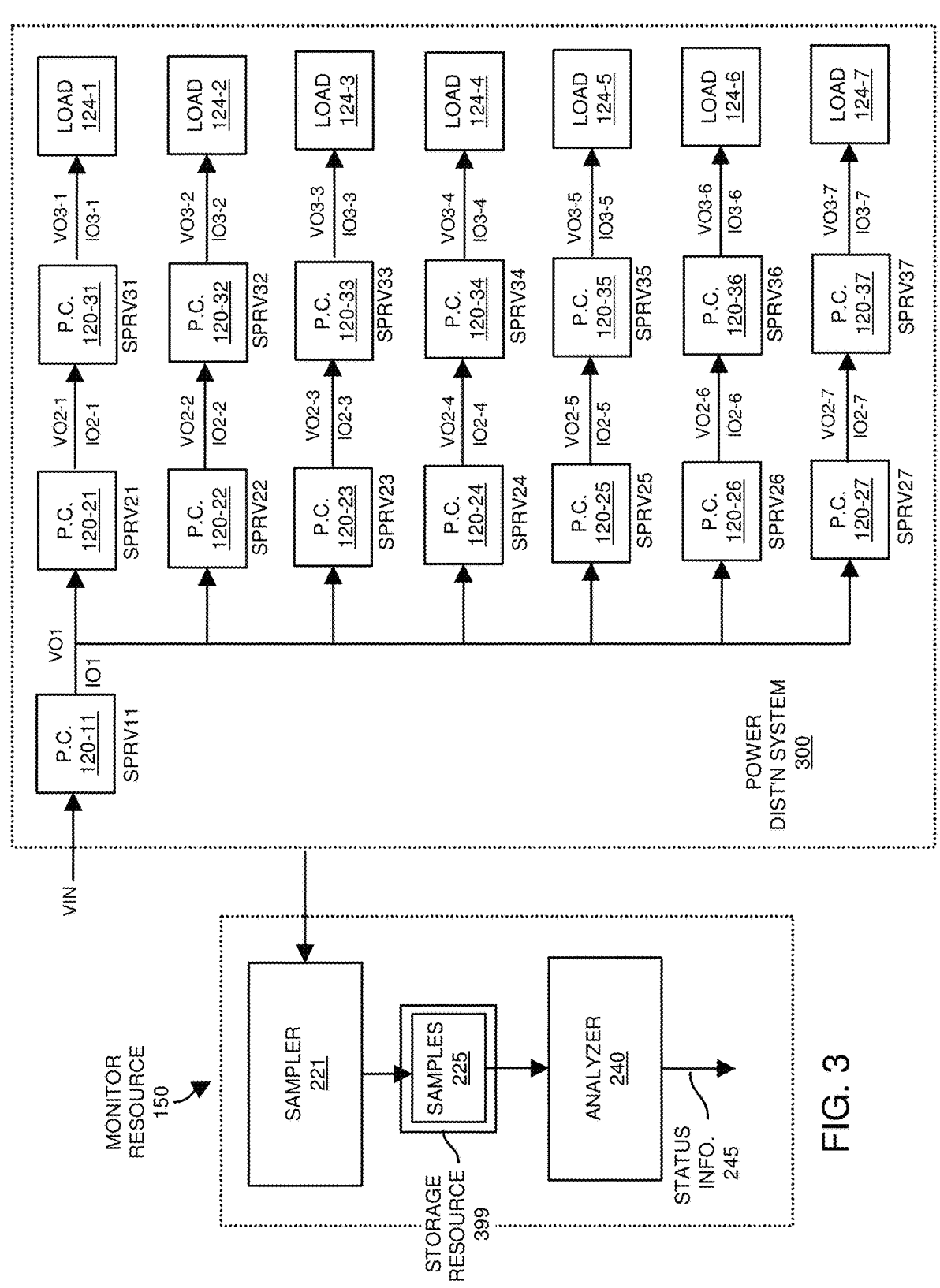
FIG. 3 is an example diagram illustrating a power distribution system as discussed herein.

FIG. 3 is an example diagram illustrating a power distribution system as discussed herein.

In this example, multiple instances of the power converter 120-X (where instances of X=11, 21, 22, 23, . . . , 27, 31, 32, . . . 37) are implemented in a hierarchy of multiple power converter stage to provide power to one or more other power converters or loads.

For example, the first power converter stage of the power distribution system 300 includes power converter 120-11; the second power converter stage of the power distribution system 300 includes power converter 120-21, power converter 120-22, power converter 120-23, power converter 120-24, power converter 120-25, power converter 120-26, and power converter 120-27; the third power converter stage of the power distribution system 300 includes power converter 120-31, power converter 120-32, power converter 120-33, power converter 120-34, power converter 120-35, power converter 120-36, and power converter 120-37.

Further in this example, in a manner as previously discussed, the power converter 120-11 receives input voltage VIN and converts it into the output voltage VO1. A magnitude of the output voltage VO1 is a function the magnitude of the input voltage VIN and the magnitude of the output current IO1 (where IO1 is a total amount of current supplied to power converters 120-21, 120-22, 120-23, 120-24, 120-25, 120-26, and 120-27). More specifically, in a manner as previously discussed, the power converter 120-11 produces the magnitude of the setpoint reference voltage SPRV11 depending on the magnitude of the output current IO1 and magnitude of the output voltage VO1. A respective controller in the power converter 120-11 then produces the output voltage VO1 to be substantially equal to a magnitude of the setpoint reference voltage SPRV11.

Each of the power converters (120-21, 120-22, 120-23, 120-24, 120-25, 120-26, 120-27) in the second power converter stage of the power distribution system 300 receives the output voltage VO1 as an input voltage to produce a respective output voltage.

For example, the power converter 120-21 produces a respective setpoint reference voltage SPRV21 based on a magnitude of the input voltage VO1 and magnitude of the corresponding output current IO2-1 supplied to the power converter 120-31. In such an instance, the power converter 120-21 regulates a magnitude of the output voltage VO2-1 with respect to the setpoint reference voltage SPRV21.

The power converter 120-22 produces a respective setpoint reference voltage SPRV22 based on a magnitude of the input voltage VO1 and magnitude of the corresponding output current 102-2 supplied to the power converter 120-32. In such an instance, the power converter 120-22 regulates a magnitude of the output voltage VO2-2 with respect to the setpoint reference voltage SPRV22.

The power converter 120-23 produces a respective setpoint reference voltage SPRV23 based on a magnitude of the input voltage VO1 and magnitude of the corresponding output current IO2-3 supplied to the power converter 120-33. In such an instance, the power converter 120-23 regulates a magnitude of the output voltage VO2-3 with respect to the setpoint reference voltage SPRV23.

The power converter 120-24 produces a respective setpoint reference voltage SPRV24 based on a magnitude of the input voltage VO1 and magnitude of the corresponding output current IO2-4 supplied to the power converter 120-34. In such an instance, the power converter 120-24 regulates a magnitude of the output voltage VO2-4 with respect to the setpoint reference voltage SPRV24.

The power converter 120-25 produces a respective setpoint reference voltage SPRV25 based on a magnitude of the input voltage VO1 and magnitude of the corresponding output current 102-5 supplied to the power converter 120-35. In such an instance, the power converter 120-25 regulates a magnitude of the output voltage VO2-5 with respect to the setpoint reference voltage SPRV25.

The power converter 120-26 produces a respective setpoint reference voltage SPRV26 based on a magnitude of the input voltage VO1 and magnitude of the corresponding output current 102-6 supplied to the power converter 120-36. In such an instance, the power converter 120-26 regulates a magnitude of the output voltage VO2-6 with respect to the setpoint reference voltage SPRV26.

The power converter 120-27 produces a respective setpoint reference voltage SPRV27 based on a magnitude of the input voltage VO1 and magnitude of the corresponding output current 102-7 supplied to the power converter 120-37. In such an instance, the power converter 120-27 regulates a magnitude of the output voltage VO2-7 with respect to the setpoint reference voltage SPRV27.

Each of the power converters (120-31, 120-32, 120-33, 120-34, 120-35, 120-36, 120-37) in the third power converter stage of the power distribution system 300 receives a respective output voltage as an input voltage to produce a respective output voltage.

For example, the power converter 120-31 produces a respective setpoint reference voltage SPRV31 based on a magnitude of the voltage VO2-1 and magnitude of the corresponding output current IO3-1 supplied to the load 124-1. In such an instance, the power converter 120-31 regulates a magnitude of the output voltage VO3-1 with respect to the setpoint reference voltage SPRV31.

The power converter 120-32 produces a respective setpoint reference voltage SPRV32 based on a magnitude of the voltage VO2-2 and magnitude of the corresponding output current IO3-2 supplied to the load 124-2. In such an instance, the power converter 120-32 regulates a magnitude of the output voltage VO3-2 with respect to the setpoint reference voltage SPRV32.

The power converter 120-33 produces a respective setpoint reference voltage SPRV33 based on a magnitude of the voltage VO2-3 and magnitude of the corresponding output current IO3-3 supplied to the load 124-3. In such an instance, the power converter 120-33 regulates a magnitude of the output voltage VO3-3 with respect to the setpoint reference voltage SPRV33.

The power converter 120-34 produces a respective setpoint reference voltage SPRV34 based on a magnitude of the voltage VO2-4 and magnitude of the corresponding output current IO3-4 supplied to the load 124-4. In such an instance, the power converter 120-34 regulates a magnitude of the output voltage VO3-4 with respect to the setpoint reference voltage SPRV34.

The power converter 120-35 produces a respective setpoint reference voltage SPRV35 based on a magnitude of the voltage VO2-5 and magnitude of the corresponding output current IO3-5 supplied to the load 124-5. In such an instance, the power converter 120-35 regulates a magnitude of the output voltage VO3-5 with respect to the setpoint reference voltage SPRV35.

The power converter 120-36 produces a respective setpoint reference voltage SPRV36 based on a magnitude of the voltage VO2-6 and magnitude of the corresponding output current IO3-6 supplied to the load 124-6. In such an instance, the power converter 120-36 regulates a magnitude of the output voltage VO3-6 with respect to the setpoint reference voltage SPRV36.

The power converter 120-37 produces a respective setpoint reference voltage SPRV37 based on a magnitude of the voltage VO2-7 and magnitude of the corresponding output current IO3-7 supplied to the load 124-7. In such an instance, the power converter 120-37 regulates a magnitude of the output voltage VO3-7 with respect to the setpoint reference voltage SPRV37.

As further shown, the power supply system as discussed herein may include a respective monitor respective 150 such as including sampler 221 and analyzer 240. Each of the resources can be configured as hardware, software, or a combination of hardware and software. For example, the monitor resource 150 can be configured as monitor hardware, monitor software, or a combination of monitor hardware in monitor software; the sampler 221 can be configured as sampler hardware, sampler software, and/or sampler hardware and sampler software; analyzer 240 can be configured as analyzer hardware, analyzer software, and/or analyzer hardware and analyzer software; and so on.

In general, during operation, the sampler 221 receives sample output voltages associated with each of the power converters for each of multiple sample times. For example, during a first sample time, the sampler 221 receives first feedback indicating a first sample magnitude of the input voltage VIN, first sample magnitude of the output voltage VO1, first sample magnitude of the output voltage VO2-1, first sample magnitude of the output voltage VO2-2, first sample magnitude of the output voltage VO2-3, first sample magnitude of the output voltage VO2-4, first sample magnitude of the output voltage VO2-5, first sample magnitude of the output voltage VO2-6, first sample magnitude of the output voltage VO2-7, first sample magnitude of the output voltage VO3-1, first sample magnitude of the output voltage VO3-2, first sample magnitude of the output voltage VO3-3, first sample magnitude of the output voltage VO3-4, first sample magnitude of the output voltage VO3-5, first sample magnitude of the output voltage VO3-6, first sample magnitude of the output voltage VO3-7, and so on.

During a second sample time subsequent to the first sample time, the sampler 221 receives second feedback indicating a second sample magnitude of the input voltage VIN, second sample magnitude of the output voltage VO1, second sample magnitude of the output voltage VO2-1, second sample magnitude of the output voltage VO2-2, second sample magnitude of the output voltage VO2-3, second sample magnitude of the output voltage VO2-4, second sample magnitude of the output voltage VO2-5, second sample magnitude of the output voltage VO2-6, second sample magnitude of the output voltage VO2-7, second sample magnitude of the output voltage VO3-1, second sample magnitude of the output voltage VO3-2, second sample magnitude of the output voltage VO3-3, second sample magnitude of the output voltage VO3-4, second sample magnitude of the output voltage VO3-5, second sample magnitude of the output voltage VO3-6, second sample magnitude of the output voltage VO3-7, and so on.

During a third sample time subsequent to the second sample time, the sampler 221 receives third feedback indicating a third sample magnitude of the input voltage VIN, third sample magnitude of the output voltage VO1, third sample magnitude of the output voltage VO2-1, third sample magnitude of the output voltage VO2-2, third sample magnitude of the output voltage VO2-3, third sample magnitude of the output voltage VO2-4, third sample magnitude of the output voltage VO2-5, third sample magnitude of the output voltage VO2-6, third sample magnitude of the output voltage VO2-7, third sample magnitude of the output voltage VO3-1, third sample magnitude of the output voltage VO3-

2, third sample magnitude of the output voltage VO3-3, third sample magnitude of the output voltage VO3-4, third sample magnitude of the output voltage VO3-5, third sample magnitude of the output voltage VO3-6, third sample magnitude of the output voltage VO3-7, and so on.

Thus, the monitor resource 150 and corresponding sampler 221 can be configured to receive samples of all the different output voltages associated with the power converters in the power distribution system 300 for each of multiple sample times. If desired, the monitor resource 150 and corresponding sampler 221 can be configured to also receive samples of the different magnitudes of the output currents associated with each of the power converters.

As further shown, the sampler 221 stores the corresponding received samples as previously discussed as samples 225 in the storage resource 399. The received sample information can be stored as sequences of output voltages, one sequence for each sample time.

As further discussed herein, the analyzer 240 monitors the sequences output voltages over time to determine occurrence of one or more anomalies associated with one or more corresponding power converters. Because each respective power converter configured to produce a respective output voltage that depends upon the magnitude of respective output current of the power converter and corresponding magnitude of the input voltage of the power converter, there is a correlation amongst the output voltages of the power converters. In other words, if a respective power converter experiences a respective failure or anomaly condition such as consuming excess current, any of the corresponding power converter connected to the anomalous power converter will experience a change in voltage even though they may not be experiencing an anomaly condition themselves. As further discussed herein, analysis of the sequence of output voltages over time provides an indication of one or more power converters that is experiencing a respective anomaly condition.

Example configurations of each of the power converters in the power distribution system 300 is shown in FIG. 4.

FIG. 4 is an example diagram illustrating configuration settings and monitoring samples of under different conditions associated with the power converters in the power distribution system in FIG. 3 as discussed herein.

As shown in FIG. 4, as indicated by the equation 400, each of the power converters is configured to generate a respective output voltage Vout (VOX) as a function of: i) a target voltage (VtargX) assigned to the power converter 120-X, ii) Rho X (adjustment value associated with output current) assigned to a respective power converter 120-X, and iii) Alpha X (adjustment value associated with input voltage) assigned to a respective power converter 120-X. A combination of Rho X and Alpha X assigned to the Xth power converter 120-X provides a way to encode an interdependency of a network of power converters with respect to each other, enabling anomaly detection. In other words, implementation of the equation 400 for each of the different power converters as described herein causes an anomaly in one power converter to be visible to the analyzer based on that anomalous power converter causing a change in output voltage to other power converters (either in a prior stage, same stage, or subsequent stage of the hierarchy) in the power distribution system 300.

More specifically, via implementation of the equation 400 for each of the power converters, the setpoint reference voltage generator 155-X as discussed herein can be configured to: receive a first target output voltage value (VTARGX) assigned to the Xth power converter; receive a first input voltage value (121-SX) indicative of the magnitude of the Xth input voltage 121-X for the power converter 120-X; receive an Xth output current value (125-X) indicative of the magnitude of the Xth output current 125-X supplied by the first output voltage 123-X; derive the setpoint reference voltage SPRVX for regulating the first output voltage VOX (123-X) based on the Xth target output voltage (VTARGX), the Xth input voltage value, and the Xth output current value; and regulate the magnitude of the Xth output voltage VOX (123-X) to be substantially equal to the setpoint reference voltage SPRVX. Note that the input voltage VINX (actual input voltage) may be adjusted by VINnominalX assigned to the Xth power converter 120-X to produce the difference (VINX-VINnominalX). This difference is multiplied by the value Alpha for the Xth power converter.

Thus, each setpoint reference voltage generator can be configured to generate a respective setpoint reference voltage based on: i) application of a first weight value (such as Rho) to the magnitude of the first output current, and ii) application of a second weight value (Alpha) to a difference between the magnitude of the first input voltage Vin and a nominal voltage value Vin-nomassociated with generating the first input voltage.

In this example, the design parameters (as indicated by graph 401) associated with the power converter 120-11 are as follows: VTARG=12 VDC, Imax=33.6 AMPS, power converter efficiency=0.98, Rho=0.0229, Alpha=0.

The design parameters associated with the power converter 120-21 are as follows: VTARG=5 VDC, Imax=1 AMP, power converter efficiency=0.98, Rho=0.1, Alpha=0.0833.

The design parameters associated with the power converter 120-22 are as follows: VTARG=1 VDC, Imax=250 AMPS, power converter efficiency=0.95, Rho=0.004, Alpha=0.167.

The design parameters associated with the power converter 120-23 are as follows: VTARG=5 VDC, Imax=5 AMPS, power converter efficiency=0.92, Rho=0.02, Alpha=0.0833.

The design parameters associated with the power converter 120-24 are as follows: VTARG=3.3 VDC, Imax=10 AMPS, power converter efficiency=0.92, Rho=0.01, Alpha=0.05.

The design parameters associated with the power converter 120-25 are as follows: VTARG=1.2 VDC, Imax=15 AMPS, power converter efficiency=0.94, Rho=0.0067, Alpha=0.02.

The design parameters associated with the power converter 120-26 are as follows: VTARG=1 VDC, Imax=35 AMPS, power converter efficiency=0.94, Rho=0.029, Alpha=0.0167.

The design parameters associated with the power converter 120-27 are as follows: VTARG=1.8 VDC, Imax=8 AMPS, power converter efficiency=0.94, Rho=0.0125, Alpha=0.03.

Example System—Voltages in Detection enhanced system under nominal operation (blue) vs operating with anomalous power converter 120-22 (a.k.a., POL2) (modeled as decreased efficiency).

Note that under less than Imax conditions, individual voltages are still in the range of operation expected, but on the aggregate, they are ALL lower than they would be if there was no anomaly.

Note that anomalies are detectable via by analyzing some or all the voltages, possibly along with other available system information (currents, temperatures, work loads, etc.)

In this example, the sampler 221 produces sample data 225-1 based on monitoring the output voltages (VO1, VO2-1, VO2-2, VO2-3, . . . VO2-7, VO3-1, VO3-2, . . . VO3-7, etc.) associated with each of the interconnected power converters.

When there are no anomalies associated with any of the power converters in the power distribution system 300: i) for one or more first sample times, the sampler 221 produces, for Imax/2) a first sequence of output voltage values VO1=11.9930, VO2-1=4.9494, VO2-2=0.9499, VO2-3=4.9494, VO2-4=3.2496, VO2-5=1.1499, VO2-6=0.9499, VO2-7=1.7498; ii) for one or more first sample times, the sampler 221 produces, for Imax) a second sequence of output voltage values VO1=11.6410, VO2-1=4.8701, VO2-2=0.8940, VO2-3=4.8701, VO2-4=3.1803, VO2-5=1.0928, VO2-6=0.8940, VO2-7=1.6892. As expected, during higher current consumption such as Imax, the magnitude of the output voltage is lower because the output voltage for each power converter is generated based on a magnitude of the output current from each power converter. During the first and second sample sequence, and non-anomaly condition, the efficiency of the power converter 120-22 producing the output voltage VO2-2 is 0.95 meaning that 95% of power delivered to the power converter 120-22 from the output voltage VO1 is converted into power supplied by the power converter 120-22 to the power converter 120-32.

Assume that the power converter 120-22 experiences. For example, assume that the power conversion efficiency of the power converter 120-22 drops from 95 percent (eff=0.95) to 85 percent (eff=0.85). In such an instance, the power converter 120-22 consumes more current from the output voltage VO1 to produce the output voltage VO2-2 supplied to power the power converter 120-32. When this anomaly occurs, the sampler 221 produces samples 225 associated with the power distribution system 300 such as: i) for one or more third sample times, the sampler 221 produces, for Imax/2) a third sequence of output voltage values VO1=11.583, VO2-1=4.8653, VO2-2=0.8931, VO2-3=4.8653, VO2-4=3.1771, VO2-5=1.0917, VO2-6=0.8931, VO2-7=1.6875; ii) for one or more fourth sample times, the sampler 221 produces, for Imax, a fourth sequence of output voltage values VO1=11.9630, VO2-1=4.9470, VO2-2=0.9494, VO2-3=4.9470, VO2-4=3.2480, VO2-5=1.1493, VO2-6=0.9494, VO2-7=1.7489. As expected, during higher current consumption such as Imax, the magnitude of the output voltage of a respective power converter is lower because the output voltage for each power converter is generated based on a magnitude of the output current from each power converter. Thus, during the third and fourth sample sequence, and anomaly condition, the efficiency of the power converter 120-22 producing the output voltage VO2-2 is 0.85 meaning that 85% of power delivered to the power converter 120-22 from the output voltage VO1 is converted into power supplied by the power converter 120-22 to the power converter 120-32.

As previously discussed, to detect a respective anomaly condition, the analyzer 240 compares the samples and/or sequences of samples to determine occurrence of a respective anomaly condition. For example, the power converter 120-22 experiences a respective anomaly condition during conditions in which the sampler 221 produces the third sequence of fourth sequence of output voltage values. Because the power converter 120-22 experiences a decrease in power converter efficiency, the power converter 120-22 consumes additional current from the output voltage VO1 supplied by the power converter 120-11. As previously discussed, the magnitude of the output voltage VO1 depends on the magnitude of the output current IO1 of the power converter 120-11. The increase in the magnitude of the output current IO1 due to the anomaly associated with the power converter 120-22 causes the magnitude of the output voltage VO1 to drop. Further, as previously discussed, each of the magnitudes of the output voltage from the power converter depends upon the magnitude of the input voltage supplied to that power converter. Thus, the anomaly of the power converter 120-22 drawing more current from the output voltage VO1 results in the change in each of the output voltages from the sequence of power converters power converter 120-21, power converter 120-22, power converter 120-23, power converter 120-24, power converter 120-25, power converter 120-26, the power converter 120-27.

In one example, to determine the anomaly condition, the analyzer 240 compares the second sequence of output voltage values to the third sequence of output voltage values to the second sequence of output voltage value to determine an anomaly condition associated with the one or more power converters in the power distribution system 300. For example, each of the one or more output voltages in the third sequence of sample output voltages for the power converters is substantially reduced with respect to magnitudes of the same output voltages in the second sequence because the power converter 120-22 experiences a respective anomaly of operating at 85% efficiency rather than 95% efficiency. The anomalous condition is excess current consumed by the second power converter 120-22 to produce the output voltage VO2-2. As previously discussed, this extra current consumption by the circuit path 120-22 reduces a magnitude of the output voltage VO1, resulting in the lowered input voltage of each of the power converters receiving the output voltage VO1 as an input voltage to an output voltage of a lower respective magnitude.

Note further that each of the individual output voltage can be analyzed with respect to the different operational regions in FIG. 5 to determine occurrence of a respective anomaly associated with the respective power converter.

FIG. 5 is an example diagram illustrating different possible conditions associated with each of the power converters and voltage regulator with output current and input voltage dependence as discussed herein.

Graph 500 illustrates different operational states of a respective power converter as discussed herein.

Region 511 of the graph 500 indicates a condition in which the power converter is operating properly and there is no anomaly associated with the respective power converter. For example, as previously discussed in equation 400 of FIG. 4, the power converter produces a respective setpoint reference voltage based on Rho and Alpha. The respective power converter produces the corresponding output voltage in accordance with the SPRVX (or as indicated by the equation 400). During conditions in which the magnitude of the output current of the respective power converter is between 0 and Imax and the input voltage to the power converter is in a range between the values Vin and Vmax, the corresponding power converter is considered to be operating in a non-anomaly mode.

In this example, the analyzer 240 detects that a respective power converter is operating in an anomaly condition when the operating point (such as output voltage Vo) of the respective power converter falls within any of regions 521,

522, 523, 524, 525, 526, 527, and 528. For example, such conditions occur when a magnitude of the output voltage Vo and a magnitude of the output current Io for a given power converter does not fall within the operating region 511 and is also not powered to an OFF-state such as in operating regions 531, 532, 533, 534, 535, 536, 537, 538, 539, 540 and 541.

Thus, the analyzer 240 can be configured to analyze sequences of output voltages, or individual respective output voltages to determine anomaly conditions.

Figure 6:
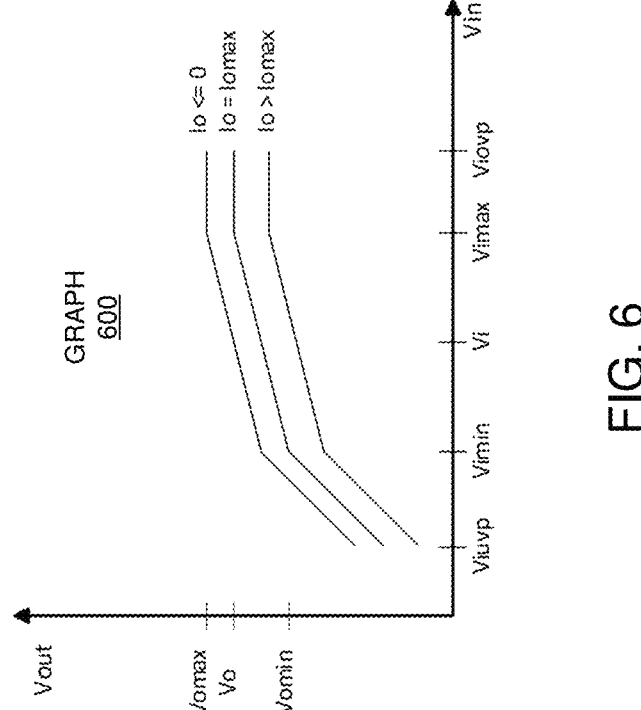
FIG. 6 is an example diagram illustrating voltage regulation with output current and input voltage dependence as discussed herein.

FIG. 6 is an example diagram illustrating voltage regulation with output current and input voltage dependence as discussed herein.

For General Characteristics as shown in graph 600:

Vi, Vo are the nominal input and output voltages (Vin, Vout) for a respective power converter Vout for the power converter decreases when Vin decreases (This is a natural relationship when there is not 100% line rejection in the voltage regulator)

Vout decreases for the respective power converter when output current (Io) increases (This is a natural relationship when there is loss in the Vout path, or a loadline is implemented)

Vout decrease for the respective power converter is accelerated when Vin exceeds its nominal range (below Vimin) or Io exceeds its nominal range (above Iomax)

Higher power dissipation in a respective power converter leads to decrease in Vout System anomalies lead to changes (generally decrease) in Vout Note that a piecewise linear relationship is shown in this example of graph 600, but the relationship could be linear or non-linear and same principles still hold. If desired, these relationships can be programmed in firmware of an enhanced digital controller or other generic structures.

Figure 7:
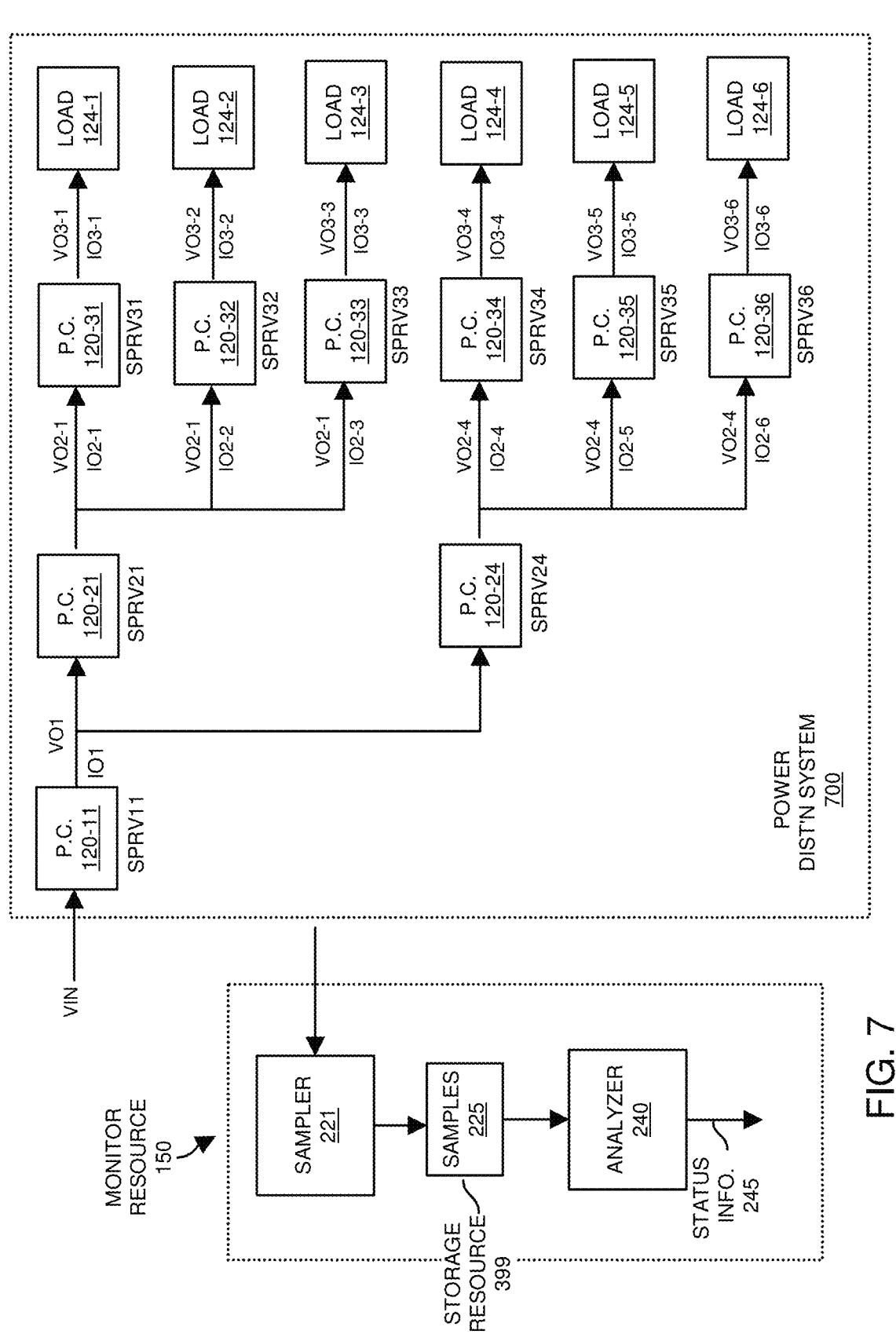
FIG. 7 is an example diagram illustrating a power distribution system as discussed herein.

FIG. 7 is an example diagram illustrating a power distribution system as discussed herein.

As previously discussed, generation of the different setpoint reference voltage SPRVX in respective regulated power converters results in a pre-defined dependency relationship between each regulators input and output voltage and current. Changes in overall system power dissipation are reflected in the different rails voltages.

Nominal voltage profiles-system anomalies (such as associated with one or more of the power converters in a respective power distribution system) results in identifiable changes in the voltage profiles. For example, some voltages could be lower or higher than expected based on one or more power converters experiencing a respective failure.

In a similar manner as previously discussed, a monitor resource (such as monitor hardware, monitor software, of a combination of monitor hardware and monitor software) can be configured to identify anomalies through small changes in the respective output voltages of the power converters. For example, monitoring can be done based on VR telemetry or additional sensors. Redundant information (such as effect of an anomaly in one power converter to multiple other power converters) increases observability of anomalies. Current sensors are more complex and expensive than voltage sensors.

The example power distribution system 700 in FIG. 7 illustrates another possible hierarchical power supply system.

For example, the first power converter stage (first column) of the power distribution system 700 includes power converter 120-11. The second power converter stage (second column) of the power distribution system 700 includes power converter 120-21 and power converter 120-24. The third power converter stage (third column) of the power distribution system 700 includes power converter 120-31, power converter 120-32, power converter 120-33, power converter 120-34, power converter 120-35, and power converter 120-36.

Further in this example, in a manner as previously discussed, the power converter 120-11 receives input voltage VIN and converts it into the output voltage VO1. A magnitude of the output voltage VO1 is controlled as a function the magnitude of the input voltage VIN and the magnitude of the output current IO1 (where IO1 is a total amount of current supplied to power converters 120-21 and 120-24). More specifically, the power converter 120-11 produces the magnitude of the setpoint reference voltage SPRV11 depending on the magnitude of the output current IO1 and magnitude of the input voltage VIN. A respective controller in the power converter 120-11 then produces the output voltage VO1 to be substantially equal to a magnitude of the setpoint reference voltage SPRV11.

Each of the power converters (120-21 and 120-24) in the second power converter stage of the power distribution system 300 receives the output voltage VO1 as an input voltage to produce a respective output voltage.

For example, the power converter 120-21 produces a respective setpoint reference voltage SPRV21 based on a magnitude of the input voltage VO1 and magnitude of the corresponding total output current IO2-1, 102-2, and IO2-3 supplied to the respective power converter 120-31, power converter 120-32, power converter 120-33. In such an instance, the power converter 120-21 regulates a magnitude of the output voltage VO2-1 with respect to the setpoint reference voltage SPRV21.

The power converter 120-24 produces a respective setpoint reference voltage SPRV24 based on a magnitude of the input voltage VO1 and magnitude of the corresponding total output current 102-4, 102-5, and IO2-6 supplied to the respective power converter 120-34, power converter 120-35, power converter 120-36. In such an instance, the power converter 120-24 regulates a magnitude of the output voltage VO2-4 with respect to the setpoint reference voltage SPRV24.

Each of the power converters (120-31, 120-32, 120-33, 120-34, 120-35, 120-36) in the third power converter stage of the power distribution system 700 receives a respective output voltage as an input voltage to produce a respective output voltage.

For example, the power converter 120-31 produces a respective setpoint reference voltage SPRV31 based on a magnitude of the voltage VO2-1 and magnitude of the corresponding output current IO3-1 supplied to the load 124-1. In such an instance, the power converter 120-31 regulates a magnitude of the output voltage VO3-1 with respect to the setpoint reference voltage SPRV31.

The power converter 120-32 produces a respective setpoint reference voltage SPRV32 based on a magnitude of the voltage VO2-1 and magnitude of the corresponding output current IO3-2 supplied to the load 124-2. In such an instance, the power converter 120-32 regulates a magnitude of the output voltage VO3-2 with respect to the setpoint reference voltage SPRV32.

The power converter 120-33 produces a respective setpoint reference voltage SPRV33 based on a magnitude of the voltage VO2-1 and magnitude of the corresponding output current IO3-3 supplied to the load 124-3. In such an instance, the power converter 120-33 regulates a magnitude of the output voltage VO3-3 with respect to the setpoint reference voltage SPRV33.

The power converter 120-34 produces a respective setpoint reference voltage SPRV34 based on a magnitude of the voltage VO2-4 and magnitude of the corresponding output current IO3-4 supplied to the load 124-4. In such an instance, the power converter 120-34 regulates a magnitude of the output voltage VO3-4 with respect to the setpoint reference voltage SPRV34.

The power converter 120-35 produces a respective setpoint reference voltage SPRV35 based on a magnitude of the voltage VO3-5 and magnitude of the corresponding output current IO3-5 supplied to the load 124-5. In such an instance, the power converter 120-35 regulates a magnitude of the output voltage VO3-5 with respect to the setpoint reference voltage SPRV35.

The power converter 120-36 produces a respective setpoint reference voltage SPRV36 based on a magnitude of the voltage VO3-6 and magnitude of the corresponding output current IO3-6 supplied to the load 124-6. In such an instance, the power converter 120-36 regulates a magnitude of the output voltage VO3-6 with respect to the setpoint reference voltage SPRV36.

The power converter 120-36 produces a respective setpoint reference voltage SPRV36 based on a magnitude of the voltage VO3-6 and magnitude of the corresponding output current IO3-6 supplied to the load 124-6. In such an instance, the power converter 120-36 regulates a magnitude of the output voltage VO3-6 with respect to the setpoint reference voltage SPRV36.

Figure 8:
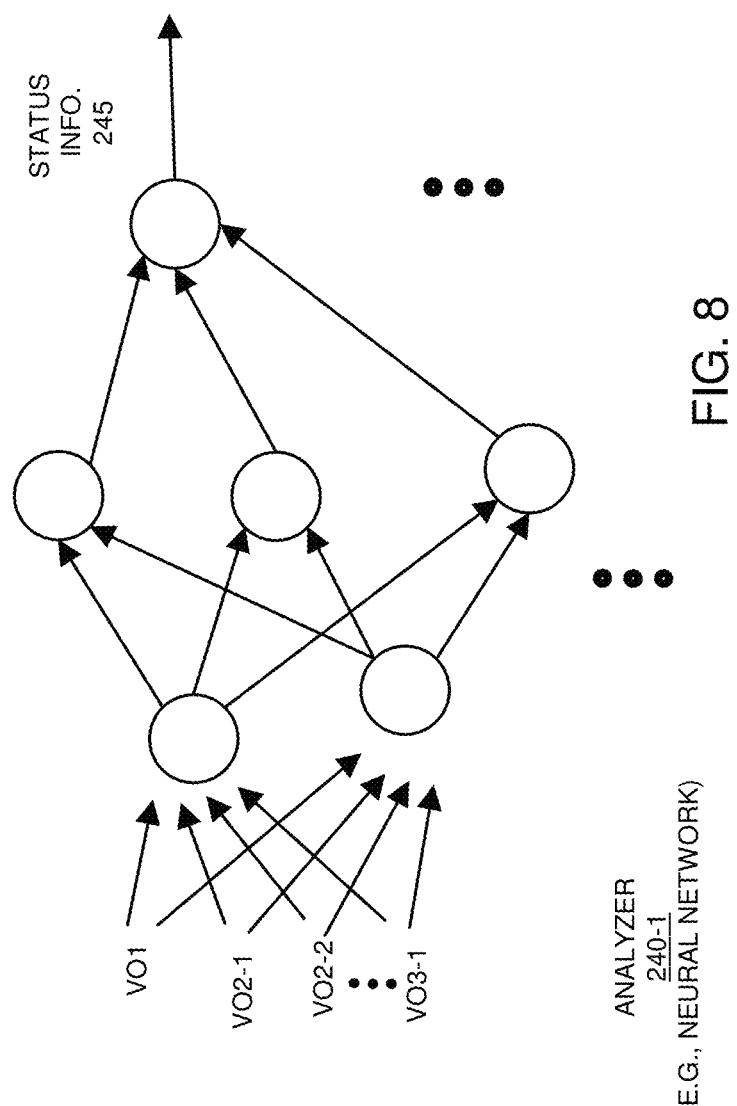
FIG. 8 is an example diagram illustrating implementation of an analyzer as a neural network as discussed herein.

FIG. 8 is an example diagram illustrating implementation of an analyzer as a neural network as discussed herein.

In this example, analyzer 240-1 is implemented as a neural network. The neural network is trained to determine if an anomaly exists based on samples of the output voltages (or other sampled parameters) associated with the power converters in the respective monitored power distribution system. More specifically, samples of the different output voltages from each of the multiple power converter is inputted to the analyzer 240-1. The analyzer 240-1 produces status information indicating information such as whether an anomaly occurs for each specific power converter, one or more groupings of power converters causing one or more anomalies, and so on.

Anomaly Detection Through Voltage Profile

In accordance with further examples, whether a neural network or not, for a given system, there exists a nominal voltage profile based on expected range of operation for all voltage rails outputted from the power converters. In other words, the storage resource 399 or other suitable entity can be configured to store prior sequences of samples of the output voltages associated with the power converters in the power distribution system. As previously discussed, the analyzer 240 can be configured to compare a receives sequence of sample output voltages associated with one or more of the power converters and compared to a stored sequence (profile indicating non-anomalous conditions) to determine the occurrence of one or more anomalies associated with the respective power converters.

The analyzer system including analyzer 240 can be configured to detect deviations from this voltage profile based on anomalies such as:

Excessive load current causing (or detectable by) a lower voltage to be present on a rail and bus supplying the rail Unexpected loads on buses causing a lower voltage to be present on bus and rails powered by the bus Poor power converter efficiency causing (or detectable by) lower voltage on bus due to higher bus current Converter dropout (inability to sustain the target output voltage) due to component degradation causing (or detectable by) lower voltage on bus or rail Excessive distribution losses causing (or detectable by) lower voltage on bus and rails driven by the bus Anomalous or failed voltage or current sensors causing (or detectable by) inconsistency in redundant measurements and deviations in overall voltage profile Dynamic power allocation limitation and mis-allocation causing (or detectable by) exceeding nominal operating ranges result in lower voltages on rail and buses Anomaly Detection Classification The implementation of Voltage Profile may fit under classical classification techniques. For example, the system may include the following:

System has a large set of unknowns (load current on all rails).

System is parametrically over-specified given the number of redundant sensors

Nominal profiles looks like a multidimensional surface.

Correlation and non-linearities are added to the system in order to facilitate detectability.

Detectability sensitivity can be very high, so that deviations in voltage can be kept very small, which is important since the ultimate goal is to provide well regulated voltages.

Anomaly Detection Supports More Complex Dynamic Allocation

Dynamic power allocation can be complex and tricky because of the interdependency of power availability when system is constrained by power allocation Anomaly detection is also helpful in providing more robust operation Local optimization of VR settings can be easily integrated into overall system profile Voltage based, looking particularly at observability/detectability of operating range corners Warnings when voltage profile indicates that operation under dynamic allocation is "closer to the edge" of being a failure or an anomaly System Rail Voltage+Temperature Profile Note further that since the anomaly detection is closely tied to healthy (i.e. optimal) operation of the power converter components, a high degree of correlation is also expected between the voltage profile and temperature profile Generally, conditions that lead to lower voltages also lead to higher temperatures.

Operation in temperatures exceeding the expected range also lead to conditions which generally will result in lower voltages on the system.

Figure 9:
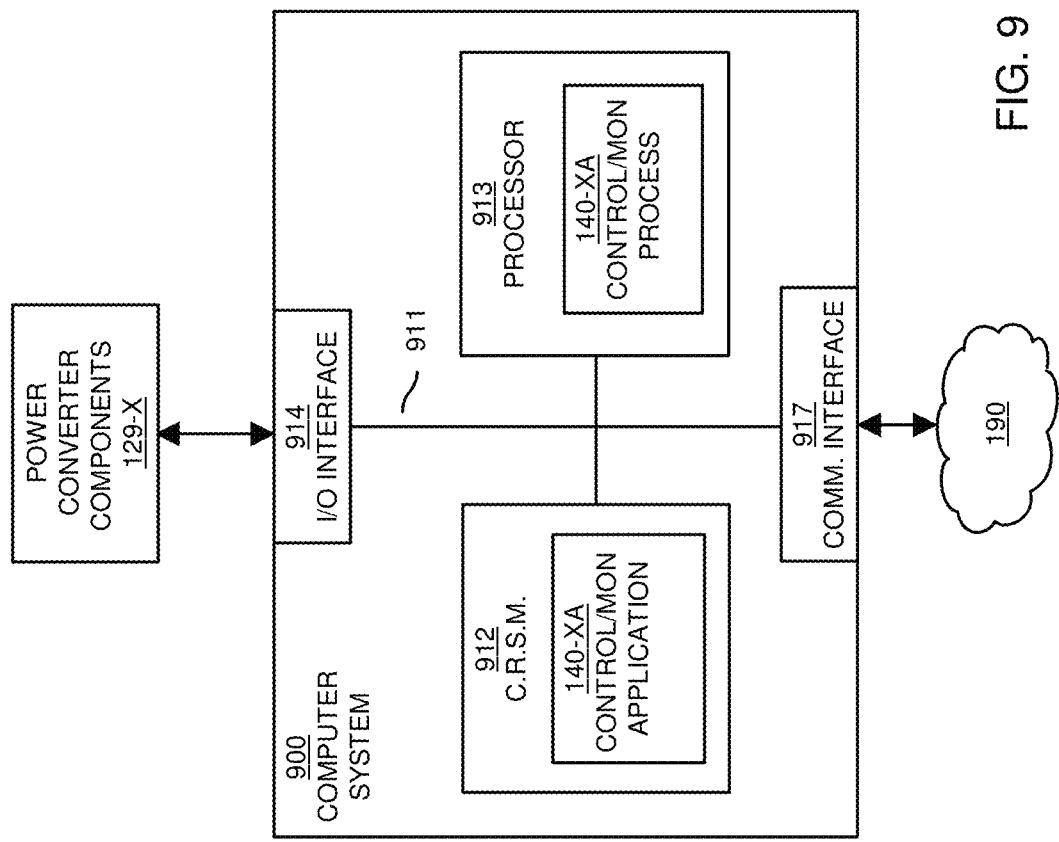
FIG. 9 is an example diagram illustrating computer processor hardware and related software instructions that execute methods as discussed herein.

FIG. 9 is an example block diagram of a computer device for implementing any of the operations as discussed herein according to examples herein.

As shown in this example, computer system 900 and application 140-XA (such as implemented by any of one or more resources such as controller 140-X, reference voltage generator 155-X, monitor resource 150, etc.) of the present example includes an interconnect 911 that couples computer readable storage media 912 such as a non-transitory type of media (or hardware storage media) in which digital information can be stored and retrieved, a processor 913 (e.g., computer processor hardware such as one or more processor devices), I/O interface 914, and a communications interface 917.

I/O interface 914 provides connectivity to any suitable circuitry such as power converter components 129-X, etc.

Computer readable storage medium 912 can be any hardware storage resource or device such as memory, optical storage, hard drive, floppy disk, etc. In one example, the computer readable storage medium 912 stores instructions and/or data used by the application 140-XA to perform any of the operations as described herein.

Further in this example, communications interface 917 enables the computer system 900 and processor 913 to communicate over a resource such as network 190 to retrieve information from remote sources and communicate with other computers.

As shown, computer readable storage media 912 is encoded with application 140-XA (e.g., software, firmware, etc.) executed by processor 913. Application 140-XA can be configured to include instructions to implement any of the operations as discussed herein.

During operation of one example, processor 913 accesses computer readable storage media 912 via the use of interconnect 911 in order to launch, run, execute, interpret or otherwise perform the instructions in application 140-XA stored on computer readable storage medium 912.

Execution of the application 140-XA produces processing functionality such as process 140-XA in processor 913. In other words, the process 140-XA associated with processor 913 represents one or more aspects of executing application 140-XA within or upon the processor 913 in the computer system 900.

In accordance with different examples, note that computer system 900 can be a micro-controller device, logic, hardware processor, hybrid analog/digital circuitry, etc., configured to control a power supply and perform any of the operations as described herein.

Functionality supported by the different resources will now be discussed via flowchart in FIGS. 10 and 11. Note that the steps in the flowcharts below can be executed in any suitable order.

Figure 10:
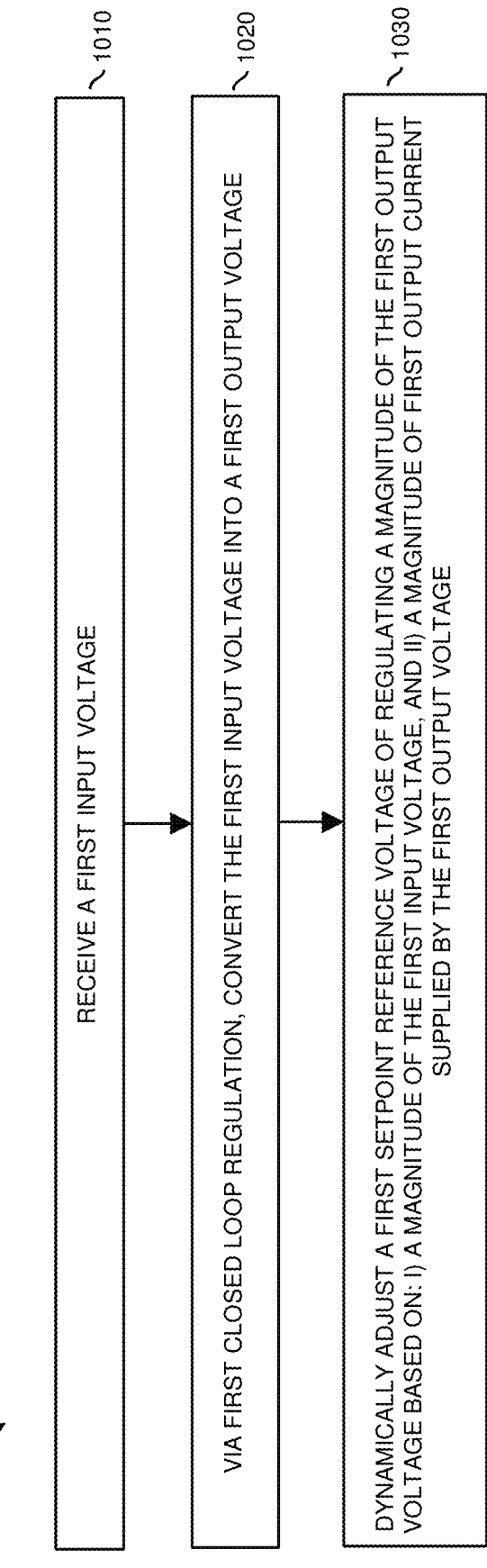
FIG. 10 is an example diagram illustrating a method as discussed herein.

FIG. 10 is an example diagram illustrating a method of controlling a switch based on monitored current according to examples herein.

In processing operation 1010, a power converter receives a first input voltage.

In processing operation 1020, via first closed loop regulation, the power converter converts the first input voltage into a first output voltage.

In processing operation 1030, the power converter dynamically adjusts a first setpoint reference voltage of regulating a magnitude of the first output voltage based on: i) a magnitude of the first input voltage, and ii) a magnitude of first output current supplied by the first output voltage.

FIG. 11 is an example diagram illustrating a method of controlling a switch based on monitored current according to examples herein.

In processing operation 1110, an analyzer receives a first sequence of sample voltages associated with a power distribution system. The first sequence of sample voltages includes a first sample of the first output voltage and a first sample of the second output voltage obtained at a first instance of time.

In processing operation 1120, the analyzer compares the first sequence of sample voltages to a second sequence of sample voltages. The second sequence of sample voltages including a second sample of the first output voltage and a second sample of the second output voltage obtained at a second instance of time. The second instance of time occurring before the first instance of time.

In processing operation 1130, based on a difference between the first sequence of sample voltages and the second sequence of sample voltages, the analyzer detects detect an anomaly associated with the first power converter.

Note again that techniques herein are well suited for providing overcurrent protection to a respective load. However, it should be noted that examples herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing." "computing," "calculating." "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred examples thereof, it will be understood by those skilled in the art that various changes in form and details may be made therein without departing from the spirit and scope of the present application as defined by the appended claims. Such variations are intended to be covered by the scope of this present application. As such, the foregoing description of examples of the present application is not intended to be limiting. Rather, any limitations to the invention are presented in the following claims.

The invention claimed is:

1. A power system comprising:
   a first power converter operative to:
      receive a first input voltage;
      via first closed loop regulation implemented by the first power converter, convert the first input voltage into a first output voltage supplied to a second power converter, a magnitude of the first output voltage regulated by the first power converter in accordance with a first setpoint reference voltage; and dynamically adjust a magnitude of the first setpoint reference voltage used to regulate the magnitude of the first output voltage based on: i) a magnitude of the first input voltage, and ii) a magnitude of first output current supplied by the first output voltage to the second power converter.

2. An analyzer operative to:

receive a sample value indicative of the magnitude of the first output voltage produced by the first power converter in claim 1; and determine an anomaly condition associated with the first power converter based on a first operational range in which the sample value resides, the first operational range being one of multiple operational ranges.

3. The power system as in claim 1, wherein the first power converter includes a first setpoint reference voltage generator operative to:

generate the first setpoint reference voltage based on: i) application of a first weight value to the magnitude of the first output current, and ii) application of a second weight value to a difference between the magnitude of the first input voltage and a nominal voltage value associated with generating the first input voltage.

4. The power system as in claim 1 further comprising:

the second power converter, wherein the second power converter is operative to:

receive the first output voltage from the first power converter;

via second closed loop regulation, convert the first output voltage into a second output voltage; and dynamically adjust a magnitude of a second setpoint reference voltage of regulating the second output voltage based on: i) a magnitude of the first output voltage received from the first power converter, and ii) a magnitude of second output current supplied by the second output voltage.

5. The power system as in claim 4 further comprising:

a storage resource operative to store status information indicating different magnitudes of the first output voltage and the second output voltage at different instances of time; and an analyzer operative to utilize the different magnitudes of the first output voltage and the second output voltage at the different instances of time to detect an anomaly associated with the second power converter producing the second output voltage.

6. The power system as in claim 4, wherein an anomalous condition of the second power converter producing the second output voltage causes an adjustment to the magnitude of the first setpoint reference voltage.

7. The power system as in claim 6, wherein the anomalous condition is excess current consumed by the second power converter to produce the second output voltage based on the first output voltage.

8. The power system as in claim 1 further comprising:

a third power converter operative to:

receive the first input voltage;

via second closed loop regulation implemented by the third power converter, convert the first input voltage into a second output voltage; and dynamically adjust a magnitude of a second setpoint reference voltage used to regulate a magnitude of the second output voltage based on: i) a magnitude of the first input voltage, and ii) a magnitude of second output current supplied by the second output voltage.

9. The power system as in claim 8, wherein an anomalous condition of the third power converter producing the second output voltage causes an adjustment to the magnitude of the first setpoint reference voltage.

10. The power system as in claim 9, wherein the anomalous condition is excess current consumed by the second power converter to produce the second output voltage based on the first input voltage.

11. The power system as in claim 8 further comprising:

a storage resource operative to store status information indicating different magnitudes of the first output voltage and the second output voltage at different instances of time;

an analyzer operative to compare the different magnitudes of the first output voltage and the second output voltage at the different instances of time to detect an anomaly associated with the third power converter producing the second output voltage.

12. The power system as in claim 11, wherein the analyzer is operative to compare a current sample magnitude of the first output voltage and a current sample magnitude of second output voltage to the status information to detect the anomaly.

13. The power system as in claim 8, wherein the dynamic adjustment of the magnitude of the first setpoint reference voltage and the dynamic adjustment of the magnitude of the second setpoint reference voltage increases a correlation between the second output voltage and the first output voltage.

14. The power system as in claim 1, wherein the first power converter includes a first setpoint reference voltage generator operative to:

receive a first target output voltage value assigned to the first power converter;

receive a first input voltage value indicative of the magnitude of the first input voltage;

receive a first output current value indicative of the magnitude of the first output current supplied by the first output voltage;

derive the first setpoint reference voltage for regulating the first output voltage based on the first target output voltage, the first input voltage value, and the first output current value; and regulate the magnitude of the first output voltage to be substantially equal to the first setpoint reference voltage.

15. A power distribution system comprising:

the first power converter in the second power converter as in claim 1; and wherein the second power converter is operative to;

receive the first output voltage;

via second closed loop regulation, convert the first output voltage into a second output voltage; and dynamically adjust a second setpoint reference voltage of regulating a magnitude of the second output voltage based on: i) a magnitude of the first output voltage, and ii) a magnitude of second output current, the second output current supplied by the second output voltage;

the power distribution system further comprising: a third power converter operative to convert the first output voltage into a third output voltage, the third output voltage regulated based on a third setpoint reference voltage, the third setpoint reference voltage generated based on a magnitude of third output current supplied by the third output voltage.

16. The power system as in claim 1, wherein the second power converter is operative to receive and convert the first output voltage into a second output voltage; and wherein an anomalous condition of the second power converter producing the second output voltage is operative to cause an adjustment to the magnitude of the first setpoint reference voltage.

17. The power system as in claim 16, wherein the anomalous condition is decreased efficiency of the second power converter converting the first output voltage into the second output voltage.

18. The power system as in claim 17, wherein the decreased efficiency of the second power converter converting the first output voltage into the second output voltage increases a magnitude of the first output current supplied by the first output voltage to the second power converter; and wherein the increased magnitude of the first output current results in the adjustment to the magnitude of the first setpoint reference voltage.

19. The power system as in claim 1, wherein an anomaly condition associated with the second power converter receiving and converting the first output voltage into a second output voltage results in the dynamic adjustment of the magnitude of the first setpoint reference voltage.

20. The power system as in claim 19 further comprising: monitor hardware operative to determine occurrence of the anomaly condition associated with the second power converter based at least in part on the dynamically adjusted magnitude of the first setpoint reference voltage.

21. The power system as in claim 19 further comprising: monitor hardware operative to determine the anomaly condition associated with the second power converter based at least in part on a range in which the first output voltage resides.

22. The power system as in claim 1, wherein the second power converter is operative to convert the first output voltage into a second output voltage; and the power system further comprising monitor hardware operative to:

receive a first sequence of sample voltages, the first sequence of sample voltages including a first sample of the first output voltage and a first sample of the second output voltage obtained at a first instance of time;

compare the first sequence of sample voltages to a second sequence of sample voltages, the second sequence of sample voltages including a second sample of the first output voltage and a second sample of the second output voltage obtained at a second instance of time, the second instance of time occurring before the first instance of time; and based on a comparison of the first sequence of sample voltages and the second sequence of sample voltages, detect an anomaly associated with the second power converter.

23. The power system as in claim 22, wherein a magnitude of the second output voltage depends on a magnitude of the first output voltage and a magnitude of second output current supplied by the second output voltage.

24. The power system as in claim 23, wherein the monitor hardware is operative to detect the anomaly based on a detected difference between the first sequence of sample voltages and the second sequence of sample voltages.

25. A method comprising:

receiving a first input voltage;

via first closed loop regulation, converting the first input voltage into a first output voltage supplied to a second power converter, a magnitude of the first output voltage being regulated in accordance with a first setpoint reference voltage; and dynamically adjusting a magnitude of the first setpoint reference voltage used to regulate the first output voltage based on: i) a magnitude of the first input voltage, and ii) a magnitude of first output current supplied by the first output voltage to the second power converter.

26. The method as in claim 25, wherein dynamically adjusting the magnitude of the first setpoint reference voltage includes:

generating the first setpoint reference voltage based on: i) application of a first weight value to the magnitude of the first output current, and ii) application of second weight value to a difference between the magnitude of the first input voltage and a nominal voltage value of generating the first input voltage.

* * * * *